(12) United States Patent
Hata et al.

(10) Patent No.: US 6,320,209 B1
(45) Date of Patent: Nov. 20, 2001

(54) EPITAXIAL LATERAL OVERGROWTH OF GALLIUM NITRIDE BASED SEMICONDUCTIVE OXIDE SELECTIVE GROWTH MASK AND METHOD FOR FABRICATING THE SAME

(75) Inventors: Toshio Hata, Nara; Shigetoshi Ito, Ikoma, both of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/301,152

(22) Filed: Apr. 28, 1999

(30) Foreign Application Priority Data

Apr. 28, 1998 (JP) .................................. 10-117948

(51) Int. Cl.$^7$ .............................. H01L 33/00; H01L 21/18
(52) U.S. Cl. .............................. 257/190; 257/79; 257/96; 438/44; 438/47; 438/481
(58) Field of Search .................................. 257/79, 84, 96, 257/97, 190; 438/44, 47, 481

(56) References Cited

U.S. PATENT DOCUMENTS 5,880,485 * 4/2000 Marx et al. ............................. 257/94
6,051,849 * 4/2000 Davis et al. .......................... 257/103

OTHER PUBLICATIONS

Underwood et al., "Selective–area regrowth of GaN field emission tips," Solid–State Electronics, vol. 41. No. 2, pp. 243–245, 1997.*
Li et al., "Characteristics of GaN Stripes Grown by Selective–Area Metalorganic Chemical Vapor Deposition," Journal of Electronic Materials, vol. 26, No. 3, pp. 306–310, 1997.*
Ng, Complete Guide to Semiconductor Devices, McGraw–Hill, Inc. pp. 382–393, 1995.*
Nakamura et al. "Long lifetime violet InGaN/GaN/AlGaN–based semiconductor lasers" Solid State Physics and Appl. 4(2):52–58, (1998) in Japanese.

* cited by examiner

Primary Examiner—Jerome Jackson, Jr.
Assistant Examiner—Bradley Wm. Baumeister
(74) Attorney, Agent, or Firm—Morrison & Foerster LLP

(57) ABSTRACT

A semiconductor light emitting device includes: a substrate; a contact layer made of a gallium nitride based compound semiconductor formed on the substrate; a stripe-shaped conductive selective growth mask formed above the contact layer; and a layered structure made of a gallium nitride based compound semiconductor. The layered structure includes at least a pair of cladding layers, formed on the conductive selective growth mask, and an active layer, including at least one layer, sandwiched by the cladding layers.

9 Claims, 9 Drawing Sheets

EPITAXIAL LATERAL OVERGROWTH OF GALLIUM NITRIDE BASED SEMICONDUCTIVE OXIDE SELECTIVE GROWTH MASK AND METHOD FOR FABRICATING THE SAME

BACKGROUND OF THE INVENTION

1. Field of the Invention

The present invention relates to a semiconductor light emitting device (e.g., a semiconductor laser device) capable of emitting light in a wavelength range of blue to ultraviolet light, and a method for fabricating such a semiconductor light emitting device. More particularly, the present invention relates to a current-blocking type gallium nitride (GaN) based compound semiconductor light emitting device (e.g., a semiconductor laser device) with high reliability, and a method for fabricating such a semiconductor light emitting device.

2. Description of the Related Art

Conventionally, a gallium nitride based compound semiconductor laser device is formed on a crystal by lateral growth using an insulating film such as an $SiO_2$ film as a selective growth mask. FIG. 11 is a cross-sectional view of a conventional semiconductor laser device fabricated by such a conventional technique.

The conventional semiconductor laser device of FIG. 11 includes a sapphire substrate 1100, a GaN underlying layer 1101, a stripe-shaped insulating selective growth mask 1102 made of $SiO_2$, an n-type GaN contact layer 1103, an n-type AlGaN cladding layer 1104, an n-type GaN optical guide layer 1105, an $In_{0.2}Ga_{0.8}N/In_{0.05}Ga_{0.95}N$ multi-quantum well active layer 1106, a p-type GaN optical guide layer 1107, a p-type AlGaN cladding layer 1108 having a ridge stripe structure 1120 located above the $SiO_2$ selective growth mask 1102, a p-type GaN contact layer 1109, an n-type electrode 1110 formed on the n-type GaN contact layer 1103, and a stripe-shaped p-type electrode 1111 formed on the p-type GaN contact layer 1109.

The n-type GaN contact layer 1103 is continuously formed on the insulating selective growth mask 1102. Actually, crystal growth of GaN for the n-type GaN contact layer 1103 starts on the portions of the GaN underlying layer 1101 corresponding to the openings of the insulating selective growth mask 1102, i.e., the portions which are not covered with the insulating selective growth mask 1102. As the growth proceeds in the thickness direction, the GaN layer gradually extends over the respective stripes of the insulating selective growth mask 1102 from both sides of the stripes, finally covering the insulating selective growth mask 1102. Thus, the n-type GaN contact layer 1103 is formed as a single layer.

In the above conventional semiconductor laser device, a current injected from the n-type electrode 1110 flows in the n-type GaN contact layer 1103 in a lateral direction, and electrons in the current recombine with holes existing in the area of the active layer 1106 located right under the ridge stripe structure 1120, thereby generating light.

In the conventional semiconductor laser device with the above configuration, electrons inevitably travel in the n-type GaN contact layer 1103 in the lateral direction to reach the p-type contact layer 1109. More specifically, electrons are required to cross the areas of the n-type GaN contact layer 1103 located above the stripes of the insulating selective growth mask 1102.

However, according to the above-mentioned conventional process, minute crystal cracks extending in the direction of crystal growth and non-grown portions tend to be formed in areas of the n-type GaN contact layer 1103, indicated by reference numeral 1150, which correspond to the centers of the respective stripes of the insulating selective growth mask 1102. This tends to block smooth flow of electrons in the n-type GaN contact layer 1103 in the lateral direction.

As a result, the series resistance of the above conventional semiconductor laser device is as high as about 45 to 140 Ω. Such a high series resistance causes heat generation and crystal distortion, which in turn reduce the lifetime of the device to 150 hours or shorter under the conditions of an ambient temperature of 60° C. and a light output of 5 mW. Such a short lifetime is not suitable for application to optical disk systems and the like.

In addition, electric field tends to concentrate in the cracks and the non-grown portions. This increases the operating voltage of the semiconductor laser device to about 15 to 30 V and often causes breaking of semiconductor laser devices.

SUMMARY OF THE INVENTION

A semiconductor light emitting device of the present invention includes: a substrate; a contact layer made of a gallium nitride based compound semiconductor formed on the substrate; a stripe-shaped conductive selective growth mask formed above the contact layer; and a layered structure made of a gallium nitride based compound semiconductor. The layered structure includes at least a pair of cladding layers, formed on the conductive selective growth mask, and an active layer, including at least one layer, sandwiched by the cladding layers.

The semiconductor light emitting device may further include a current-blocking layer formed on both sides of a stripe of the conductive selective growth mask.

The semiconductor light emitting device may further include an insulating selective growth mask in at least a portion of the current-blocking layer.

In one embodiment, the substrate is an insulating substrate, the width of the stripe of the conductive selective growth mask is smaller than the width of each stripe of the insulating selective growth mask, and an electrode is formed on a surface of the contact layer located farther from the substrate.

The conductive selective growth mask may be made of an oxide semiconductor material.

The insulating selective growth mask may be made of silicon oxide or silicon nitride.

The semiconductor light emitting device may further include a current blocking layer which has an opening at a position located above a stripe of the conductive selective growth mask.

A method for fabricating a semiconductor light emitting device according to the present invention includes the steps of: forming a contact layer made of a gallium nitride based compound semiconductor on a substrate; forming a conductive selective growth mask and an insulating selective growth mask on the contact layer; and forming a layered structure, made of a gallium nitride based compound semiconductor, above the conductive selective growth mask, the insulating selective growth mask, and the contact layer. The layered structure includes at least a pair of cladding layers and an active layer.

Thus, according to the present invention, a gallium nitride based compound semiconductor light emitting device with a low resistance, a low operating voltage, and high reliability can be provided.

By forming the insulating selective growth mask as at least a portion of the current-blocking layer, a selective current injection only at a position from which light is to be emitted, is realized.

In the case where the substrate is an insulating substrate, the width of the stripe of the conductive selective growth mask is designed to be smaller than the width of each stripe of the insulating selective growth mask, and an electrode is formed on a surface of the contact layer located farther from the substrate, the series resistance can be greatly reduced for such a semiconductor light emitting device that has the p-type electrode and the n-type electrode on the same plane.

According to the method of the present invention, an electrode can be easily formed on the contact layer.

Thus, the invention described herein makes possible the advantages of (1) providing a gallium nitride based compound semiconductor light emitting device having an extended device lifetime and a reduced series resistance, and (2) providing a method for fabricating such a semiconductor light emitting device.

These and other advantages of the present invention will become apparent to those skilled in the art upon reading and understanding the following detailed description with reference to the accompanying figures.

DESCRIPTION OF THE PREFERRED EMBODIMENTS

Hereinbelow, the present invention will be described by way of illustrative, but not restrictive examples with reference to the accompanying drawings.

Although semiconductor laser devices are described in the following embodiments, it should be understood that the present invention is also applicable to the other types of semiconductor light emitting devices such as light emitting diodes. In addition, the gallium nitride based compound semiconductor as used herein includes materials expressed as "$In_sAl_tGa_{1-s-t}N$ ($0 \leq s$, $0 \leq t$, $s+t \leq 1$)".

(Embodiment 1)

Figure 1:
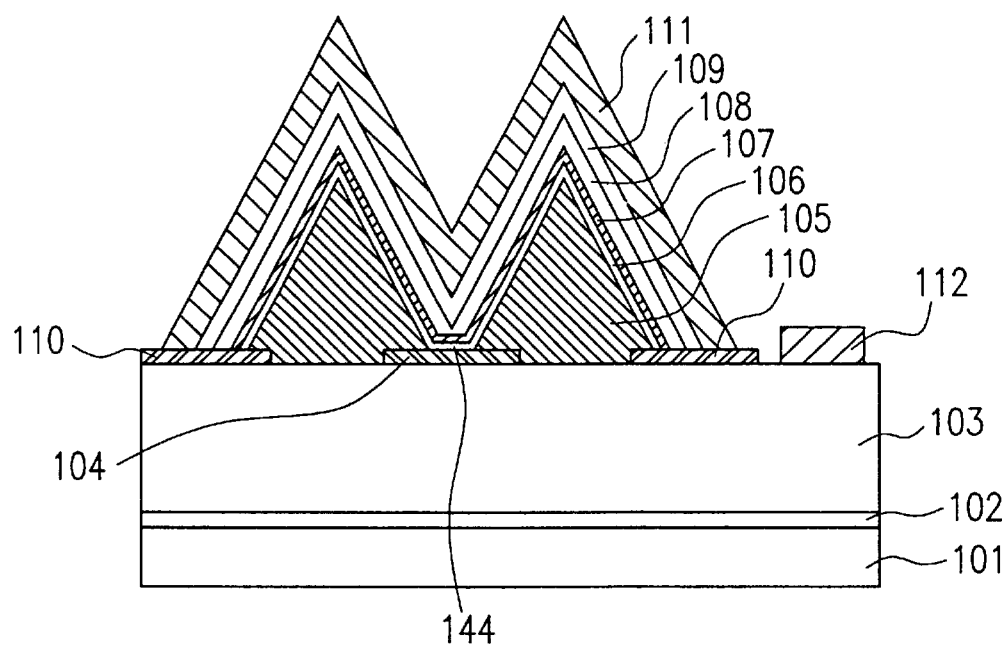
FIG. 1 is a schematic cross-sectional view of a gallium nitride based compound semiconductor light emitting device of Embodiment 1 according to the present invention.

FIG. 1 is a schematic cross-sectional view of a gallium nitride based compound semiconductor laser device as a semiconductor light emitting device of Embodiment 1 according to the present invention.

The semiconductor laser device shown in FIG. 1 includes a sapphire substrate 101, an AlN buffer layer 102, an n-type GaN contact layer 103, a conductive selective growth mask 104 made of an n-type Sn-doped $In_2O_3$ layer, an insulating selective growth mask 110 made of an $SiO_2$ film, a triangular high-resistance GaN current-blocking layer 105, an n-type $Al_{0.1}Ga_{0.9}N$ cladding layer 106, an InGaN single quantum well active layer 107, a p-type $Al_{0.1}Ga_{0.9}N$ cladding layer 108, a p-type GaN contact layer 109, a p-type electrode 111, and an n-type electrode 112.

Figure 6A:
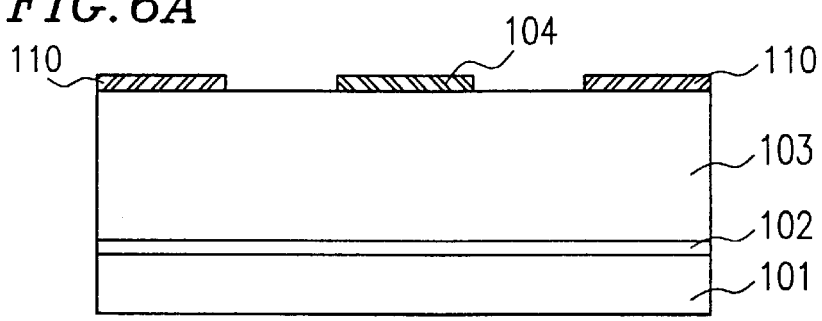
FIGS. 6A to 6C are schematic views illustrating the steps of fabricating the gallium nitride based compound semiconductor light emitting device of Embodiment 1.
Figure 6B:
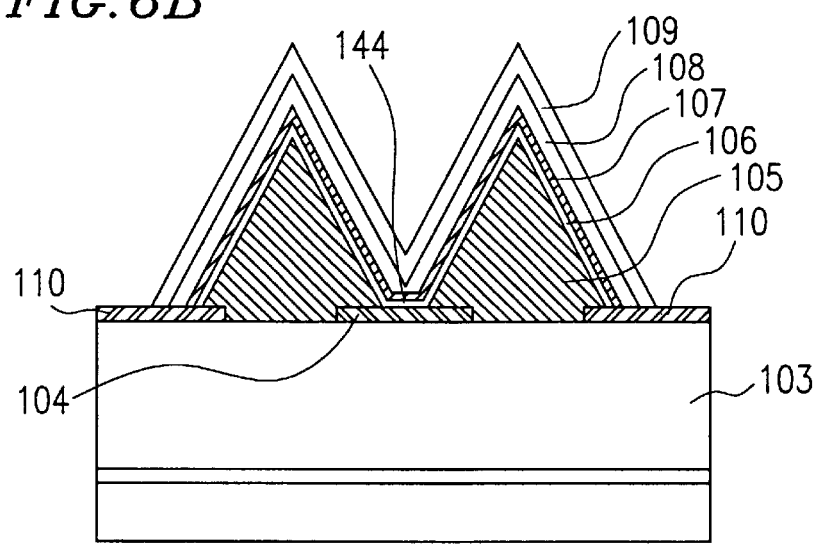
Figure 6C:
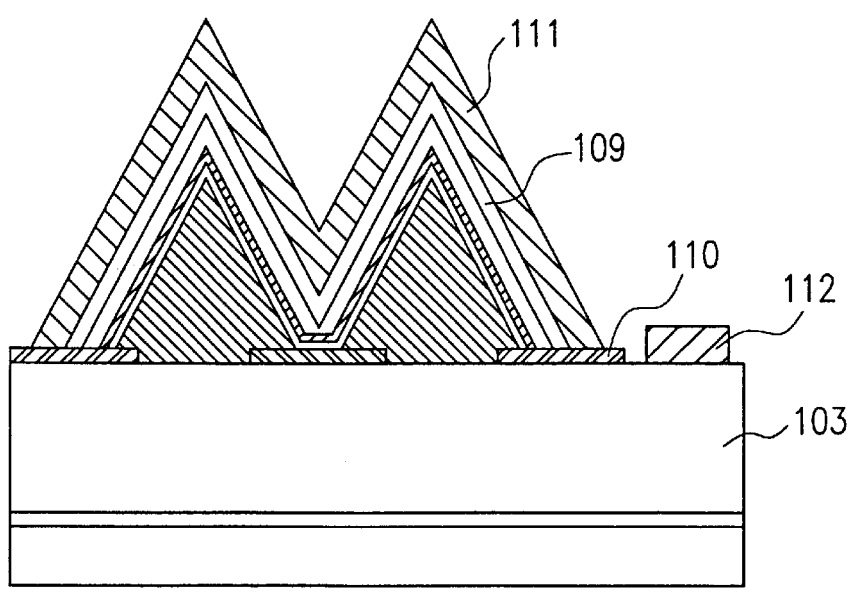

Referring to FIGS. 6A to 6C, a method for fabricating the gallium nitride based compound semiconductor laser device according to the present embodiment will be described in detail.

A metal organic chemical vapor deposition (MOCVD) method is employed, using ammonia ($NH_3$) as a V-group source material; trimethylgallium, trimethylaluminium, and trimethylindium as a III-group source material; bis(cyclopentadienyl)magnesium ($Cp_2Mg$) as a p-type impurity; monosilane as an n-type impurity; and hydrogen and nitrogen as a carrier gas.

First, referring to FIG. 6A, using an MOCVD apparatus, the AlN buffer layer 102 is formed on a C plane of the sapphire substrate 101 to a thickness of about 500 Å, and then the n-type GaN contact layer 103 is formed on the AlN buffer layer 102 to a thickness of about 10 $\mu$m, to form a layered structure on the wafer.

The wafer with the layered structure is taken out from the MOCVD apparatus, and a layer of an oxide semiconductor material having n-type conductivity, in this example, Sn-doped indium oxide ($In_2O_3$, resistivity: $1 \times 10^{-4}$ $\Omega \cdot cm$), which is to be used as the conductive selective growth mask 104, is formed over the entire surface of the wafer to a thickness of about 0.3 $\mu$m. The $In_2O_3$ layer with the thickness of about 0.3 $\mu$m for the conductive selective growth mask 104 is formed by sputtering using an $In_2O_3$—$SnO_2$ target under the conditions of an Ar pressure of $10^{-2}$ torr, a substrate temperature of 450° C., and an $O_2$ partial pressure of $3 \times 10^{-5}$ torr. In this film formation for the conductive selective growth mask 104, a low temperature of about 400 to 460° C. is used, so that nitrogen (N) atoms in the surface area of the n-type GaN contact layer 103 exposed during the film formation are not easily eliminated. The $In_2O_3$ layer is then etched with an iron chloride type etchant using a photoresist as a mask, to form the stripe-shaped conductive selective growth mask 104 having a stripe width of about 4 $\mu$m.

Subsequently, an $SiO_2$ layer which is to be used as the insulating selective growth mask 110 is formed on the entire surface of the resultant wafer to a thickness of about 0.3 $\mu$m by a normal plasma chemical vapor deposition (P-CVD) method, and then etched with a hydrofluoric acid type etchant to form the stripe-shaped insulating selective growth mask 110 having a stripe width of about 280 $\mu$m so that the stripes thereof are located about 10 $\mu$m apart from the stripes of the conductive selective growth mask 104. Thus, the stripes of the conductive selective growth mask 104 and the stripes of the insulating selective growth mask 110, both in <11–20> direction, are alternately arranged on the n-type GaN contact layer 103, as shown in FIG. 6A.

Referring to FIG. 6B, the thus-fabricated wafer, which has the stripes of the conductive selective growth mask 104 and the stripes of the insulating s elective growth mask 110 alternately arranged on the n-type GaN contact layer 103, are put in the MOCVD apparatus again. The high-resistance GaN current-blocking layer 105 having triangular cross-section ridges (resistivity: 10 Ω·cm) is formed by growing GaN for four minutes so that the thickness thereof from the surface of the n-type GaN contact layer 103 to the apex of each triangle is about 4 $\mu$m, and the width of an opening 144 formed on each stripe of the conductive selective growth mask 104 between adjacent triangular cross-section ridges is about 2 $\mu$m.

In this crystal growth process by the MOCVD method, both the conductive selective growth mask 104 and the insulating selective growth mask 110 serve to suppress GaN based crystal to be deposited on these mask strips and thus allow the high-resistance GaN current-blocking layer 105 to be formed only above the areas in which the underlying n-type GaN contact layer 103 is exposed. During this crystal growth, however, as the high-resistance GaN current-blocking layer 105 continues to grow in the thickness direction, the high-resistance GaN current-blocking layer 105 itself grows in the lateral direction, gradually extending over the conductive selective growth mask 104 and the insulating selective growth mask 110. By using this phenomenon of crystal growth, the high-resistance GaN current-blocking layer 105 is formed so as to cover both 1 $\mu$m-wide side portions of each 4 $\mu$m-wide stripe of the conductive selective growth mask 104, and thus to have the opening 144 having a width of about 2 $\mu$m in the center of the conductive mask 104.

Subsequently, the n-type $Al_{0.1}Ga_{0.9}N$ cladding layer 106 is formed to a thickness of about 0.3 $\mu$m so as to cover the high-resistance GaN current-blocking layer 105 including the opening 144. Then, after the substrate temperature is reduced to about 800° C., the InGaN single quantum well active layer 107 is formed on the cladding layer 106 to a thickness of about 3 nm. After the substrate temperature is increased to about 1050° C., the p-type $Al_{0.1}Ga_{0.9}N$ cladding layer 108 having a thickness of about 0.3 $\mu$m and then the p-type GaN contact layer 109 having a thickness of about 0.5 $\mu$m are sequentially formed. Thus, a layered structure having triangular cross-section ridges as shown in FIG. 6B is formed.

Referring to FIG. 6C, the wafer with the thus-fabricated triangular layered structure is taken out from the MOCVD apparatus. The p-type electrode 111 is formed covering the triangular layered structure. Thereafter, a portion of a stripe of the insulating selective growth mask 110 is etched away to expose the n-type GaN contact layer 103 so as to form the n-type electrode 112 on the exposed n-type GaN contact layer 103. Thus, the structure as shown in FIG. 6C is formed.

The resultant wafer is cut with a scriber or the like to form a semiconductor laser device having a width of about 300 $\mu$m and a length of about 500 $\mu$m.

In the semiconductor laser device of this embodiment with the above configuration, a current injected from the n-type electrode 112 flows into the InGaN single quantum well active layer 107 only through the opening 144 after passing in the n-type GaN contact layer 103. Accordingly, since the current is not required to cross the area of the GaN semiconductor layer located above the center of each stripe of the masks 104 and 110 at which GaN crystal growth extending from both sides of the stripe meets, as in the conventional case, to reach the InGaN single quantum well active layer 107. As a result, the series resistance of the semiconductor laser device of this embodiment is as low as about 6 to 15 Ω and the operating voltage thereof can be reduced to about 4 to 4.5 V.

The semiconductor laser device of this embodiment was subjected to a reliability test under the conditions of an ambient temperature of 60° C. and a light output of 5 mW. As a result, a lifetime of 5,500 hours or longer was confirmed.

In the semiconductor laser device according to the present embodiment, the width and shape of the opening 144 as a current path can be determined by the stripe width of the conductive selective growth mask 104 and the growth time of the high-resistance GaN current-blocking layer 105 with good reproducibility. Accordingly, a gallium nitride based compound semiconductor laser device with high reliability capable of reducing the threshold current and obtaining a stable oscillation mode can be realized.

In this embodiment, the $In_2O_3$ film is used for the conductive selective growth mask 104. Alternatively, it is confirmed that a semiconductor laser device having substantially the same shape and effects as those described above can be obtained by using $SnO_2$ as the material of the conductive mask 104. In addition, in this embodiment, the $SiO_2$ film is used for the insulating selective growth mask 110. Alternatively, substantially the same effects can be obtained by using silicon nitride of the insulating mask 110.

In this example, the width of the opening 144 is 2 $\mu$m. Substantially the same high reliability as that described above is also ensured for semiconductor laser devices fabricated with varying widths of the opening 144 of 0.5 $\mu$m, 4 $\mu$m, 8 $\mu$m, and 10 $\mu$m. It should be understood that the width of the opening 144 can be easily varied by controlling the stripe width of the conductive selective growth mask 104 and the growth time of the high-resistance GaN current-blocking layer 105.

In this embodiment, the strips of the insulating selective growth mask 110 are formed on both sides of the stripe of the conductive selective growth mask 104. Even if the insulating selective growth mask 110 is not formed, the current is also blocked by the high-resistance GaN current-blocking layer 105 and thus can be constricted into the opening 144, and thus, the effects of the present invention are obtained. In such a case, however, an additional step of removing the GaN based crystal layered structure (layers 105 to 109) by dry etching is required to expose the portion of the n-type GaN contact layer 103 prior to the formation of the n-type electrode 112. Accordingly, in view of process simplification, it is preferable to form the stripes of the insulating selective growth mask 110 on both sides of the stripe of the conductive selective growth mask 104 and to ensure that the stripe width of the insulating selective growth mask 110 is larger than that of the conductive selective growth mask 104.

In this embodiment, the stripe width of the insulating selective growth mask 110 is 280 $\mu$m. Substantially the same high reliability and device characteristics as those described above are also ensured for semiconductor laser devices fabricated with varying stripe widths of the insulating selective growth mask 110 of 20 $\mu$m, 100 $\mu$m, and 300 $\mu$m.

In this embodiment, as shown in FIG. 1, the tilt wall surface of the opening 144 of the current-blocking layer 105 is a (1-101) plane as the nature of crystal growth and thus can be controlled in the process of the crystal growth, so that the resultant opening 144 has a sharp profile. Since the refractive index (2.0) of the oxide semiconductor material constituting the conductive selective growth mask 104 is smaller than that of the InGaN single quantum well active layer 107 (2.83), the conductive selective growth mask 104 can sufficiently serve to confine light in the InGaN single quantum well active layer 107 in the vertical direction. Accordingly, the thickness of the portion of the n-type $Al_{0.1}Ga_{0.9}N$ cladding layer 106 located on the stripe of the conductive selective growth mask 104 can be reduced to 0.3 µm, as compared with a conventional thickness of 0.5 µm, which falls within a cracking-free range (less than 0.5 µm). As a result, the quantum well active layer 107 and the p-type $Al_{0.1}Ga_{0.9}N$ cladding layer 108 to be formed at least on the n-type $Al_{0.1}Ga_{0.9}N$ cladding layer 106 can be formed with good crystallinity, and thus a semiconductor laser device with good crystallinity is realized.

The oxide semiconductor material used for the conductive selective growth mask 104 preferably has n-type conductivity and the stripe width of the mask 104 is preferably in the range of about 0.5 to 10 µm. If the stripe width is less than 0.5 µm, it is difficult to control the shape of the opening 144 which is to be a current path with the growth time. If the stripe width exceeds 10 µm, the current-blocking layer 105 grows so large in the c-axis direction while the width of the opening 144 is being controlled to be 2 to 3 µm, that it becomes difficult to deposit the layered structure on the current-blocking layer 105.

Moreover, the thickness of the conductive selective growth mask 104 is preferably in the range of about 0.1 to 1 µm. If the thickness of the conductive selective growth mask 104 is less than 0.1 µm, the resistivity thereof becomes large and thus the series resistance of the semiconductor laser device becomes large. If the thickness of the conductive selective growth mask 104 exceeds 1 µm, the resistivity thereof becomes small, but the light transmittance becomes small. More preferably, the thickness of the conductive selective growth mask 104 is in the range of about 0.3 to 0.5 µm.

The thickness of the portion of the n-type $Al_{0.1}Ga_{0.9}N$ cladding layer 106 located on the stripe of the conductive selective growth mask 104 is preferably in the range of about 0.1 to 0.4 µm for preventing cracking. Both the conductive selective growth mask 104 and the n-type $Al_{0.1}Ga_{0.9}N$ cladding layer 106 serve as the cladding structure for the active layer 107. Accordingly, in this embodiment, the preferable cladding structure having a total thickness of about 0.6 to 0.8 µm is established.

Thus, in the semiconductor laser device of this embodiment, the crystal growth layers are formed so that the portion of the active layer 107 located right above the stripe of the conductive selective growth mask 104 protrudes downward. Consequently, a refractive index distribution in the lateral direction can be established for the active layer 107. As a result, a current-blocking type gallium nitride based compound semiconductor laser device capable of having a stable oscillation mode can be realized. Since the conductive selective growth mask 104 having a refractive index smaller than that of the active layer 107 is formed below the active layer 107, light can be confined in the active layer 107 even if the cladding layer 106 is thin. When the cladding layer 106 is thin, cracks which tend to be generated when the thickness of the cladding layer 106 exceeds about 0.5 µm are prevented, and thus improved crystallinity is realized for the layered structure including the active layer 107 which is to be formed on the cladding layer 106. As a result, a semiconductor laser device with good reliability is realized.

(Embodiment 2)

Figure 2:
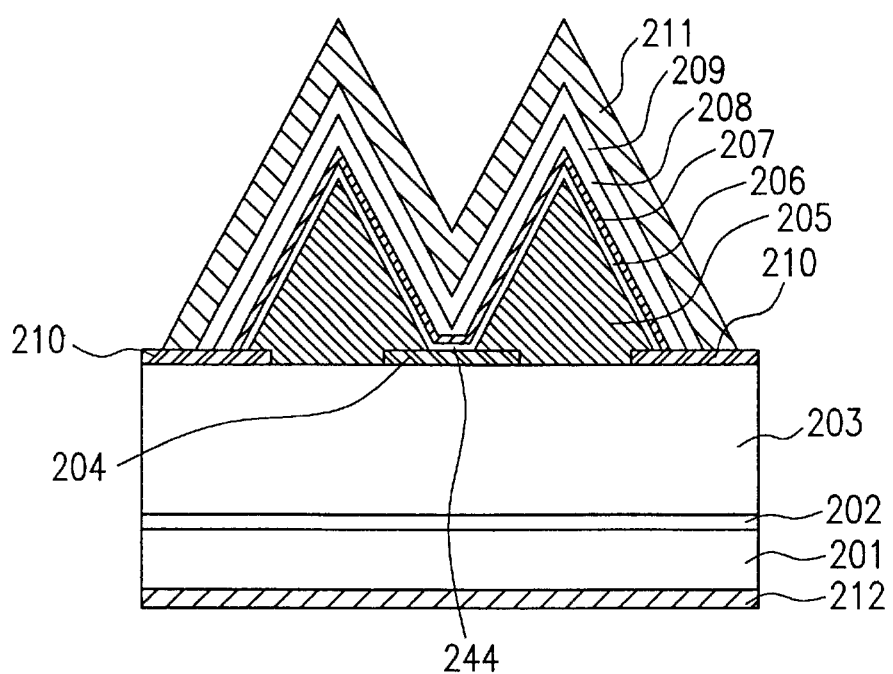
FIG. 2 is a schematic cross-sectional view of a gallium nitride based compound semiconductor light emitting device of Embodiment 2 according to the present invention.

FIG. 2 is a schematic cross-sectional view of a gallium nitride based compound semiconductor laser device as a semiconductor light emitting device of Embodiment 2 according to the present invention.

The semiconductor laser device shown in FIG. 2 includes an n-type GaN substrate 201, an n-type GaN buffer layer 202, an n-type GaN contact layer 203, a conductive selective growth mask 204 made of an n-type Sb-doped $SnO_2$ layer, an insulating selective growth mask 210 made of an $Si_3N_4$ film, a triangular cross-section p-type GaN current-blocking layer 205, an n-type $Al_{0.1}Ga_{0.9}N$ cladding layer 206, an InGaN multi-quantum well active layer 207 composed of non-doped $In_{0.2}Ga_{0.8}N$ quantum well layers and a non-doped $In_{0.01}Ga_{0.99}N$ barrier layer, p-type $Al_{0.1}Ga_{0.9}N$ cladding layers 208, a p-type GaN contact layer 209, and a p-type electrode 211. The device further includes an n-type electrode 212 formed on the back surface of the n-type GaN substrate 201. The wafer with the above configuration is cut with a scriber or the like to form a semiconductor laser device having a width of about 300 µm and a length of about 600 µm.

In the semiconductor laser device of this embodiment with the above configuration, the width and shape of a current path (an opening 244) can be formed with good reproducibility by controlling only the time required for the growth of the p-type GaN current blocking layer 205, as in Embodiment 1. This allows for reducing the threshold current, and thus a gallium nitride based compound semiconductor laser with high reliability and a stable oscillation mode can be realized.

Moreover, since the substrate used in this embodiment is conductive, the n-type electrode 212 can be formed on the back surface of the conductive substrate 201. This allows for assembling the semiconductor laser device more easily than in Embodiment 1.

Figure 7A:
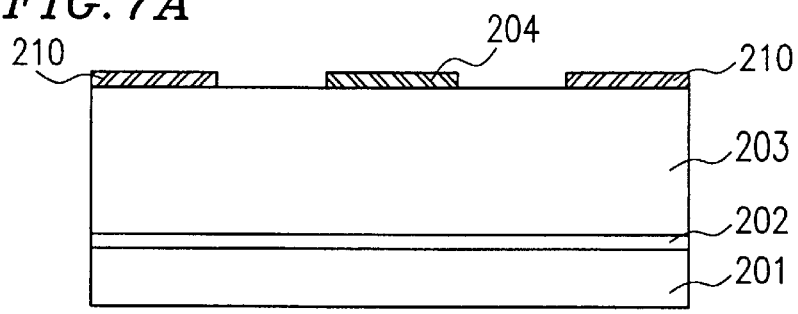
FIGS. 7A to 7C are schematic views illustrating the steps of fabricating the gallium nitride based compound semiconductor light emitting device of Embodiment 2.
Figure 7B:
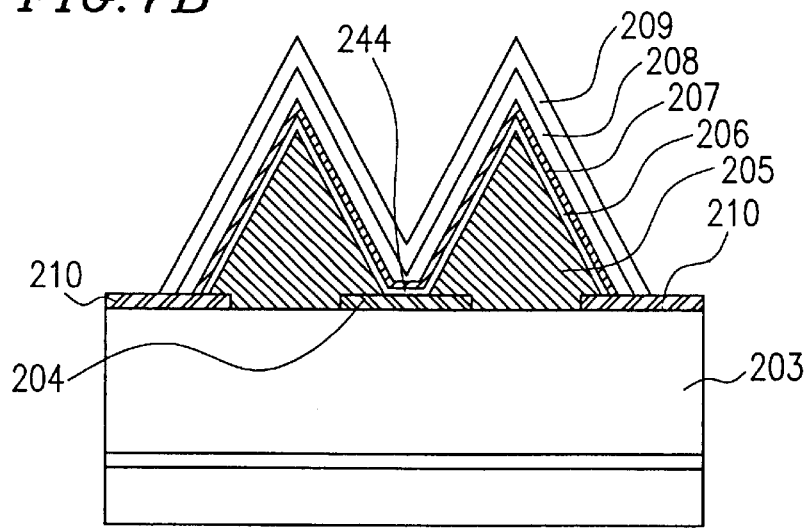
Figure 7C:
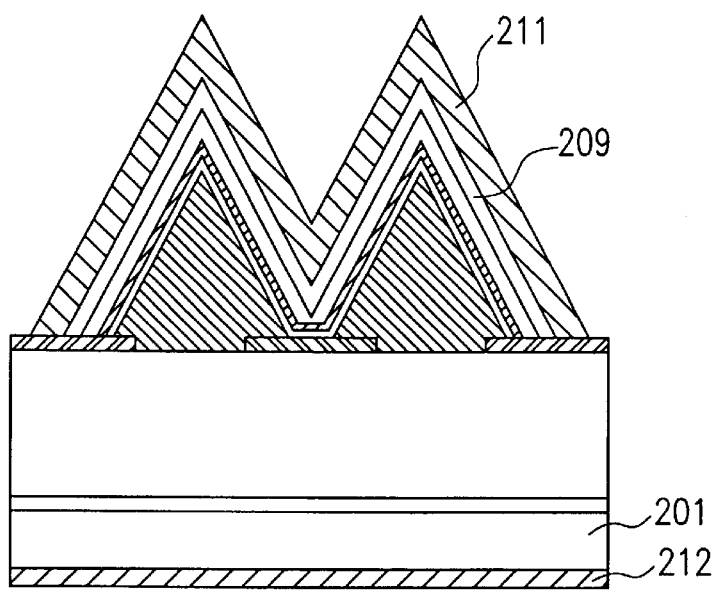

Referring to FIGS. 7A to 7C, a method for fabricating the gallium nitride based compound semiconductor laser device of this embodiment according to the present invention will be described in detail. The growth method, the V-group source material, the III-group source material, the p-type impurity, the n-type impurity, and the carrier gas used in this embodiment are the same as those described in Embodiment 1.

First, referring to FIG. 7A, using an MOCVD apparatus, the n-type GaN buffer layer 202 is formed on a conductive substrate, for example, the n-type GaN substrate 201, to a thickness of about 35 nm, and then the n-type GaN contact layer 203 is formed on the n-type buffer layer 202 to a thickness of about 10 µm, to form a layered structure on the wafer.

The wafer with the layered structure is taken out from the MOCVD apparatus, and a layer of an oxide semiconductor material having n-type conductivity, in this example, Sb-doped tin oxide ($SnO_2$, resistivity: $3 \times 10^{-4}$ Ω·cm), which is to be used as the conductive selective growth mask 204, is formed over the entire surface of the wafer to a thickness of about 0.5 µm. The $SnO_2$ layer of the thickness of about 0.5 µm for the conductive selective growth mask 204 is formed by sputtering using an $SnO_2$—Sb target under the conditions of an Ar—$O_2$ mixed gas atmosphere of $5 \times 10^{-2}$ torr and a substrate temperature of 350° C. The $SnO_2$ layer is then etched to form the stripe-shaped conductive selective growth mask 204 having a stripe width of about 5 µm.

Subsequently, an $Si_3N_4$ layer which is to be used as the insulating selective growth mask 210 is formed on the entire surface of the wafer to a thickness of about 0.3 µm by a normal P-CVD method, and then etched with a hydrofluoric acid type etchant to form the stripe-shaped insulating selective growth mask 210 having a stripe width of about 280 µm so that the stripes thereof are located about 10 µm apart from the stripes of the conductive selective growth mask 204. More specifically, a plurality of sets of the 5 µm-wide stripe of the conductive selective growth mask 204 and the 280 µm-wide stripe of the insulating selective growth mask 210, both in <11–20 > direction, are formed on the n-type GaN contact layer 203, as shown in FIG. 7A.

Referring to FIG. 7B, the thus-fabricated wafer is put in the MOCVD apparatus again. The p-type GaN current-blocking layer 205 having triangular cross section ridges is formed on the conductive selective growth mask 204, the insulating selective growth mask 210, and the n-type GaN contact layer 203 by growing GaN for five minutes at a substrate temperature of 1050° C. so that the thickness thereof (i.e., the height from the surface of the n-type GaN contact layer 203 to the apex of the triangle) is about 5 µm and the width of the opening 244 formed on the strip of the conductive selective growth mask 204 between the adjacent triangular cross-section ridges is about 3 µm.

Subsequently, the n-type $Al_{0.1}Ga_{0.9}N$ cladding layer 206 is formed to a thickness of about 0.3 µm so as to cover the p-type GaN current-blocking layer 205 including the opening 244. Then, after the substrate temperature is reduced to about 800° C., the InGaN multi-quantum well active layer 207 composed of two non-doped $In_{0.2}Ga_{0.8}N$ quantum well layers each having a thickness of 2 nm and a non-doped $In_{0.01}Ga_{0.99}N$ barrier layer having a thickness of 5 nm is formed on the cladding layer 206. After the substrate temperature is increased to about 1050° C., the p-type $Al_{0.1}Ga_{0.9}N$ cladding layer 208 having a thickness of about 0.3 µm and the p-type GaN contact layer 209 having a thickness of about 0.5 µm are sequentially formed. Thus, a layered structure having triangular cross-section ridges as shown in FIG. 7B is formed.

Referring to FIG. 7C, the wafer with the thus-fabricated triangular layered structure is taken out from the MOCVD apparatus. The p-type electrode 211 is formed covering the triangular layered structure. Thereafter, the n-type electrode 212 is formed on the back surface of the n-type GaN substrate 201, so as to form the structure as shown in FIG. 7C.

The resultant wafer is cut into chips having a size as described previously to form a semiconductor laser device.

In the semiconductor laser device of this embodiment, a current is prevented from crossing the areas of the GaN semiconductor layer located above the stripes of the conductive selective growth mask 204 and the insulating selective growth mask 210, as in Embodiment 1. Moreover, in this example, a current is injected from the back surface of the n-type GaN substrate 201 into the InGaN multi-quantum well active layer 207 via the conductive selective growth mask ($Sn_2O_3$ film) 204. Thus, in this embodiment, the device resistance can be further reduced to about 3 to 10 Ω compared with Embodiment 1 in which lateral flow of a current is necessary. The operating voltage is also reduced to about 3.8 to 4.5 V.

The lifetime of the device was found to be as long as about 7,800 hours under the conditions of an ambient temperature of 60° C. and a light output of 5 mW.

In the semiconductor laser device according to the present embodiment, the width and shape of the opening 244 as a current path through which a current flows can be determined by the stripe width of the $Sn_2O_3$ conductive selective growth mask 204 and the growth time of the p-type GaN current-blocking layer 205 with good reproducibility. Accordingly, the threshold current can be reduced to about 25 mA, as compared with a value of 50 mA in the conventional semiconductor laser device. Thus, a gallium nitride based compound semiconductor laser device with high reliability and a stable oscillation mode can be realized.

Moreover, since the n-type GaN substrate 201 used in this embodiment is conductive, the n-type electrode 212 can be formed on the back surface of the substrate. Accordingly, the semiconductor laser device of this embodiment can be assembled more easily than that of Embodiment 1.

In this embodiment, unlike Embodiment 1, since the conductive substrate is used as described above, the n-type electrode is not required to be disposed on the main face of the semiconductor laser device. Accordingly, the formation of the insulating selective growth mask 210 made of an $Si_3N_4$ film on both sides of the stripe of the conductive selective growth mask 204 may be omitted. In this case, although the cross-section of the ridges of the current-blocking layer 205 is no more a triangle, the shape of the portion of the current-blocking layer 205 in the vicinity of the stripe of the conductive selective growth mask 204 remains the same. Therefore, substantially the same effects as those obtained by the configuration having the insulating selective growth mask 210 are obtained.

(Embodiment 3)

Figure 3:
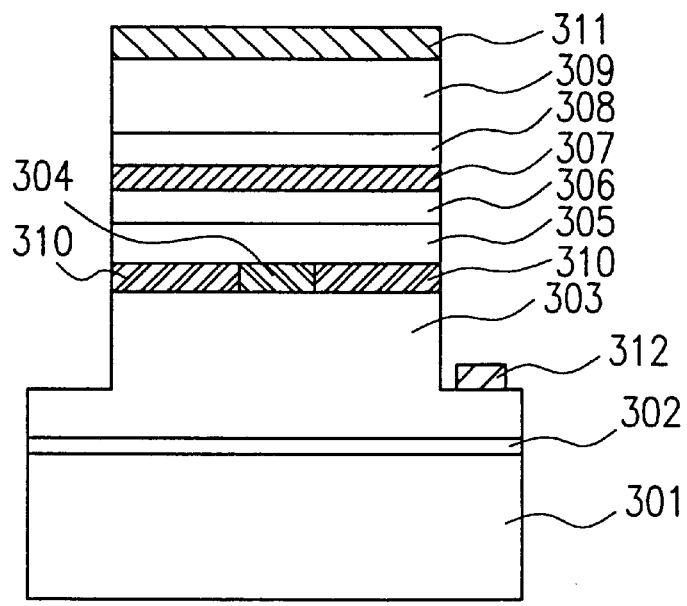
FIG. 3 is a schematic cross-sectional view of a gallium nitride based compound semiconductor light emitting device of Embodiment 3 according to the present invention.

FIG. 3 is a schematic cross-sectional view of a gallium nitride based compound semiconductor laser device as a semiconductor light emitting device of Embodiment 3 according to the present invention.

The semiconductor laser device shown in FIG. 3 includes a sapphire substrate 301, an AlN buffer layer 302, an n-type GaN contact layer 303, a conductive selective growth mask 304, an insulating selective growth mask 310, an n-type GaN planarizing layer 305, an n-type $Al_{0.05}Ga_{0.95}N$ cladding layer 306, an InGaN multi-quantum well active layer 307 composed of non-doped $In_{0.2}Ga_{0.8}N$ quantum well layers and non-doped $In_{0.01}Ga_{0.99}N$ barrier layers, a p-type $Al_{0.05}Ga_{0.95}N$ cladding layer 308, a p-type GaN contact layer 309, a p-type electrode 311, and an n-type electrode 312. Such a semiconductor laser device is processed into a chip having a width of 400 µm and a cavity length of 500 µm.

Figure 8A:
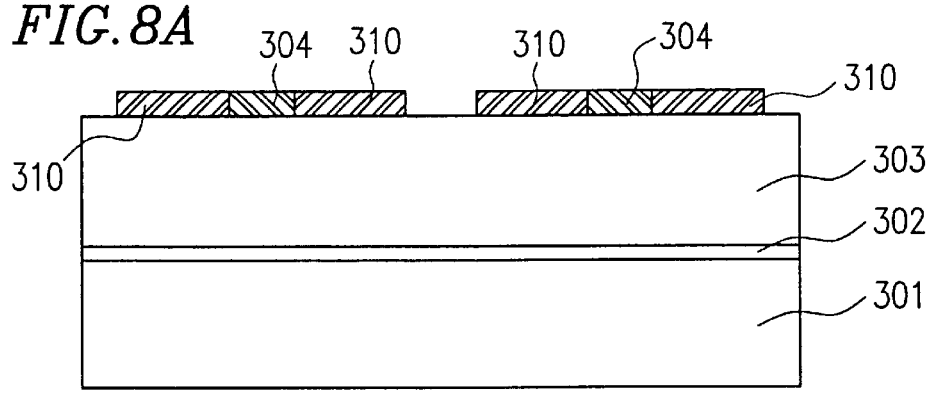
FIGS. 8A to 8C are schematic views illustrating the steps of fabricating the gallium nitride based compound semiconductor light emitting device of Embodiment 3.
Figure 8B:
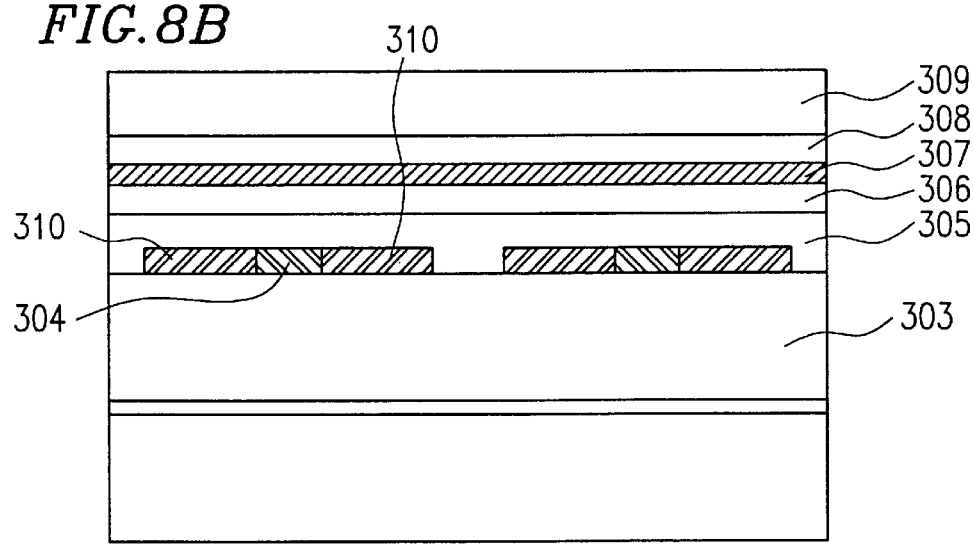
Figure 8C:
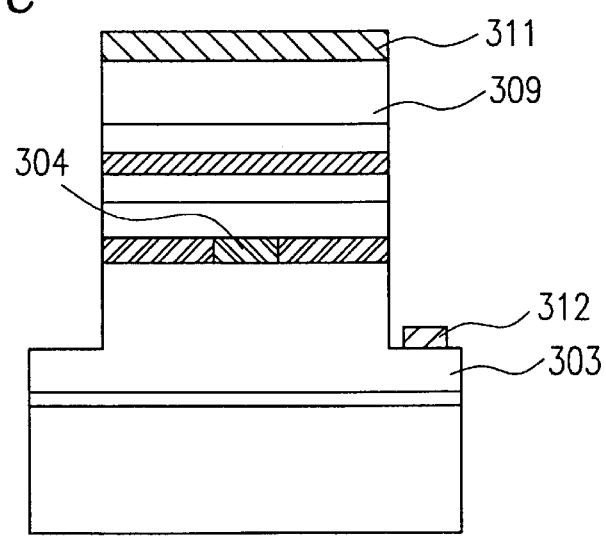

Referring to FIGS. 8A to 8C, a method for fabricating the gallium nitride based compound semiconductor laser device according to the present embodiment will be described in detail. The growth method, the V-group source material, the III-group source material, the p-type impurity, the n-type impurity, and the carrier gas used in this embodiment are the same as those described in Embodiment 1.

First, referring to FIG. 8A, using an MOCVD apparatus, the AlN buffer layer 302 is formed on the sapphire substrate 301 to a thickness of about 50 nm, and then the n-type GaN contact layer 303 is formed on the AlN buffer layer 302 to a thickness of about 10 µm, to form a layered structure on the wafer.

The wafer with the layered structure is taken out from the MOCVD apparatus, and an Sn-doped $In_2O_3$ layer which is to be used as the conductive selective growth mask 304 is formed over the entire surface of the n-type GaN contact layer 303 to a thickness of about 0.3 µm by sputtering using an $In_2O_3$—$SnO_2$ target under the conditions of an Ar pressure of $10^{-2}$ torr, a substrate temperature of 450° C., and an $O_2$ partial pressure of $3\times10^{-5}$ torr. The Sn-doped $In_2O_3$ layer is then etched with an iron chloride type etchant using a photoresist as a mask, to form the stripe-shaped conductive selective growth mask 304 having a stripe width of 4 µm.

Subsequently, an $SiO_x$ layer which is to be used as the insulating selective growth mask 310 is formed on the entire surface of the resultant wafer to a thickness of about 0.3 μm by a normal electron beam deposition method, and then etched with a hydrofluoric acid type etchant to remove the portions of the $SiO_x$ layer which are located on the stripes of the conductive selective growth mask 304 made of the Sn-doped $In_2O_3$ film. As a result, the conductive selective growth mask 304 and the insulating selective growth mask 310 are formed so that each 2 μm-wide stripe of the Sn-doped $In_2O_3$ conductive selective growth mask 304 in <11–20> direction is sandwiched by the stripes of the $SiO_x$ insulating selective growth mask 310 in the horizontal direction, as shown in FIG. 8A.

Referring to FIG. 8B, the thus-fabricated wafer is put in the MOCVD apparatus again. The n-type GaN planarizing layer 305 having a thickness of about 4 μm and the n-type $Al_{0.05}Ga_{0.95}N$ cladding layer 306 having a thickness of about 0.3 μm are formed in this order on the conductive selective growth mask 304 and the insulating selective growth mask 310 at a substrate temperature of 1050° C. Then, after the substrate temperature is reduced to about 750° C., the InGaN multi-quantum well active layer 307 composed of two non-doped $In_{0.2}Ga_{0.8}N$ quantum well layers each having a thickness of 2 nm and three non-doped $In_{0.01}Ga_{0.99}N$ barrier layers each having a thickness of 5 nm is formed on the cladding layer 306. After the substrate temperature is increased to about 1050° C., the p-type $Al_{0.05}Ga_{0.95}N$ cladding layer 308 having a thickness of about 0.3 μm and then the p-type GaN contact layer 309 having a thickness of about 0.5 μm are formed sequentially on the active layer 307. Thus, a layered structure as shown in FIG. 8B is formed.

Referring to FIG. 8C, the wafer with the thus-fabricated layered structure is taken out from the MOCVD apparatus, and the p-type electrode 311 is formed on the layered structure. Thereafter, the resultant layered structure is partly etched away with a photoresist (not shown) as a mask to expose the n-type GaN contact layer 303, and the n-type electrode 312 is formed on the exposed surface of the n-type GaN contact layer 303. Thus, the structure as shown in FIG. 8C is formed.

The resultant wafer is cut into chips having the size as described previously to form a light emitting device.

Thus, in the semiconductor laser device of this embodiment, the n-type electrode 312 is formed on the n-type GaN contact layer 303 at a position lower (i.e., closer to the substrate 301) than the selective growth masks 304 and 310. A current therefore flows via the n-type GaN contact layer 303, the conductive selective growth mask 304, then-type GaN planarizing layer 305, and the n-type AlGaN cladding layer 306 into the multi-quantum well active layer 307 without being affected by minute crystal cracks and non-grown portions which may exist in the areas of the GaN semiconductor layer located above the selective growth masks 304 and 310. Thus, in this embodiment, increases in the device resistance and the operating voltage which occur in the conventional semiconductor laser device are effectively suppressed, realizing the device resistance of about 4 to 10 Ω and the operating voltage of about 4 to 5 V.

Moreover, according to the present embodiment, a current supplied from the p-type electrode 311 flows through the stripe of the conductive selective growth mask 304, as a current path, sandwiched by the stripes of the insulating selective growth mask 310. Accordingly, the current path can be controlled by controlling the stripe width of the conductive selective growth mask 304, and the insulating selective growth mask 310 serves as a current-blocking layer. This realizes a structure of a current-blocking type semiconductor laser device. Thus, a gallium nitride based compound semiconductor laser device with good reliability capable of reducing the threshold current is achieved.

A reliability test was performed under the conditions of an ambient temperature of 60° C. and a light output of 5 mW. As a result, a lifetime of 10,000 hours was confirmed.

(Embodiment 4)

Figure 4:
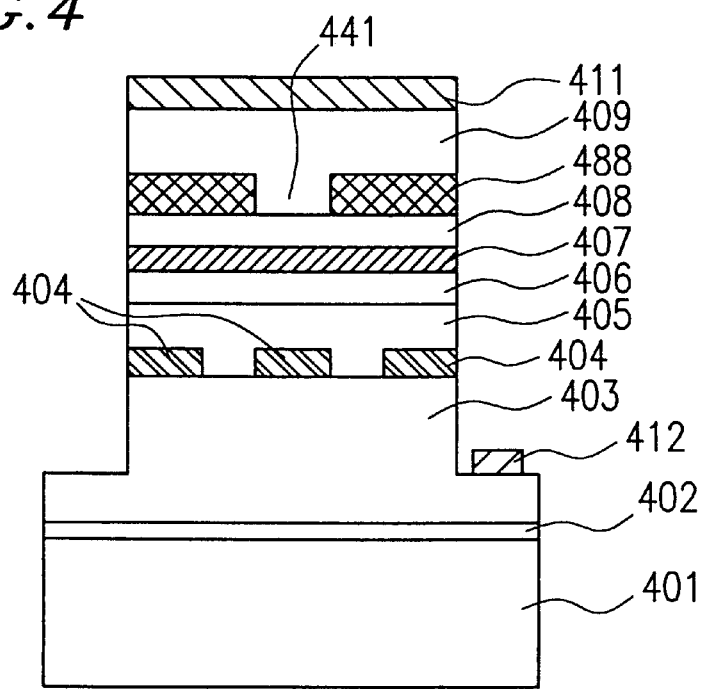
FIG. 4 is a schematic cross-sectional view of a gallium nitride based compound semiconductor light emitting device of Embodiment 4 according to the present invention.

FIG. 4 is a schematic cross-sectional view of a gallium nitride based compound semiconductor laser device as a semiconductor light emitting device of Embodiment 4 according to the present invention.

The semiconductor laser device shown in FIG. 4 includes as sapphire substrate 401, an AlN buffer layer 402, an n-type GaN contact layer 403, a conductive selective growth mask 404 made of an Sn-doped $In_2O_3$ layer, an n-type GaN planarizing layer 405, an n-type $Al_{0.05}Ga_{0.95}N$ cladding layer 406, an InGaN multi-quantum well active layer 407 composed of non-doped $In_{0.2}Ga_{0.8}N$ quantum well layers and non-doped $In_{0.01}Ga_{0.99}N$ barrier layers, a p-type $Al_{0.05}Ga_{0.95}N$ cladding layer 408, an n-type $Al_{0.05}Ga_{0.95}N$ current-blocking layer 488, a p-type GaN contact layer 409, a p-type electrode 411, and an n-type electrode 412. Such a semiconductor laser device is processed into a chip having a width of 300 μm and a length of 500 μm.

Figure 9A:
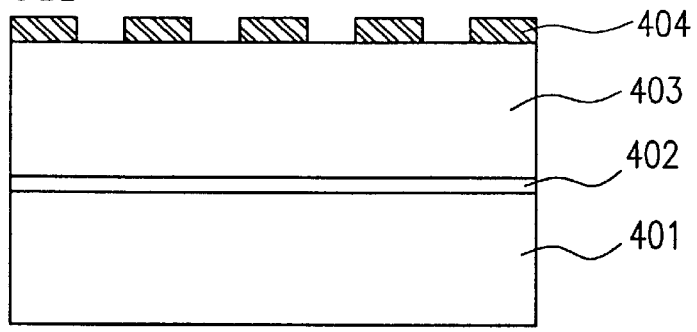
FIGS. 9A to 9C are schematic views illustrating the steps of fabricating the gallium nitride based compound semiconductor light emitting device of Embodiment 4.
Figure 9B:
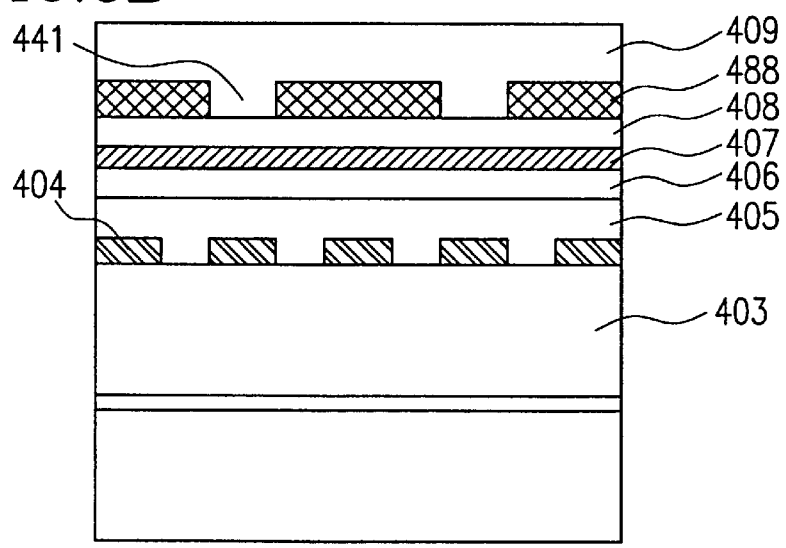
Figure 9C:
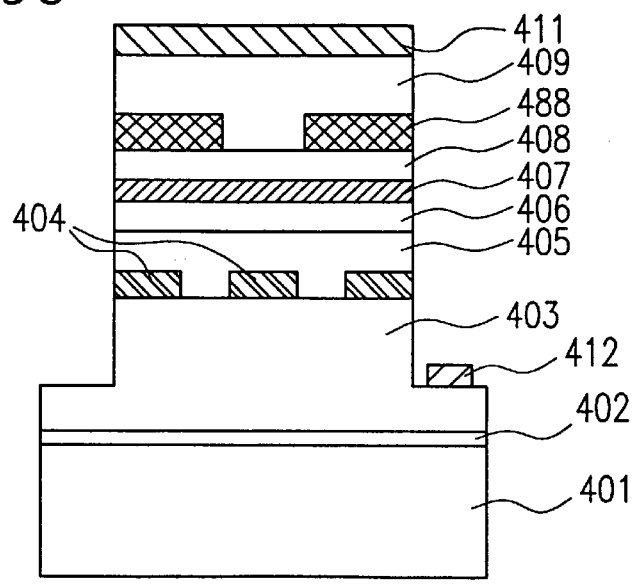

Referring to FIGS. 9A to 9C, a method for fabricating the gallium nitride based compound semiconductor laser device according to the present invention will be described in detail. The growth method, the V-group source material, the III-group source material, the p-type impurity, the n-type impurity, and the carrier gas used in this embodiment are the same as those described in Embodiment 1.

First, referring to FIG. 9A, using an MOCVD apparatus, the AlN buffer layer 402 is formed on the sapphire substrate 401 to a thickness of about 50 nm, and then the n-type GaN contact layer 403 is formed on the AlN buffer layer 402 to a thickness of about 5 μm, to form a layered structure on the wafer.

The wafer with the layered structure is taken out from the MOCVD apparatus, and an Sn-doped $In_2O_3$ layer having n-type conductivity, which is to be used as the conductive selective growth mask 404, is formed over the entire surface of the n-type GaN contact layer 403 to a thickness of about 0.3 μm. The Sn-doped $In_2O_3$ layer is then etched in a method similar to that described in Embodiment 1, to form the stripe-shaped conductive selective growth mask 404 having a stripe width of about 3 μm and a gap between strips of about 5 to 7 μm. Thus, a plurality of stripes of the conductive selective growth mask 404 made of Sn-doped $In_2O_3$ are arranged on the n-type GaN contact layer 403 as shown in FIG. 9A.

Referring to FIG. 9B, the thus-fabricated wafer is put in the MOCVD apparatus again. The n-type GaN planarizing layer 405 having a thickness of about 4 μm and the n-type $Al_{0.05}Ga_{0.95}N$ cladding layer 406 having a thickness of about 0.3 μm are formed in this order on the conductive selective growth mask 404 and the n-type GaN contact layer 403 at a substrate temperature of 1050° C. Then, after the substrate temperature is reduced to about 750° C., the InGaN multi-quantum well active layer 407 composed of two non-doped $In_{0.2}Ga_{0.8}N$ quantum well layers each having a thickness of 2 nm and three non-doped $In_{0.01}Ga_{0.99}N$ barrier layers each having a thickness of 5 nm is formed on the cladding layer 406. After the substrate temperature is increased to about 1050° C., the p-type $Al_{0.05}Ga_{0.95}N$ cladding layer 408 having a thickness of about 0.3 μm and then the n-type $Al_{0.05}Ga_{0.95}N$ current-blocking layer 488 having a thickness of about 0.3 μm are formed in this order, to form a layered structure.

The wafer with the resultant layered structure is taken out from the MOCVD apparatus again, and the n-type $Al_{0.05}Ga_{0.95}N$ current-blocking layer 488 is partly etched away to form openings 441. The respective openings 441 are formed so as to be located right above the stripes of the conductive selective growth mask 404 via the active layer 407 existing therebetween.

The resultant wafer is put in the MOCVD apparatus again, and the p-type GaN contact layer 409 having a thickness of 0.5 μm is formed over the openings 441, the n-type $Al_{0.05}Ga_{0.95}N$ current-blocking layer 488, and the p-type $Al_{0.05}Ga_{0.95}N$ cladding layer 408. Thus, a layered structure as shown in FIG. 9B is formed.

Referring to FIG. 9C, the wafer with the thus-fabricated layered structure is taken out from the MOCVD apparatus, and the p-type electrode 411 is formed on the p-type GaN contact layer 409. Thereafter, the resultant layered structure is partly etched away to expose the n-type GaN contact layer 403, and the n-type electrode 412 is formed on the exposed surface of the n-type GaN contact layer 403. In this way, the structure as shown in FIG. 9C is formed.

The resultant wafer is cut into chips having the size as described previously to form a current-constricting type semiconductor laser device.

Thus, in the semiconductor laser device of this embodiment, the n-type electrode 412 is formed on the n-type GaN contact layer 403 at a position lower (i.e., closer to the substrate 401) than the conductive selective growth mask 404. A current therefore flows via the n-type GaN contact layer 403, either the conductive selective growth mask 404 or the n-type GaN planarizing layer 405, and the n-type AlGaN cladding layer 406 into the active layer 407. Accordingly, the current is prevented from crossing the areas of the GaN semiconductor crystal layer located above the stripes of the conductive selective growth mask 404 in the lateral direction. Thus, in this embodiment, a semiconductor laser device with a low resistance and a low operating voltage is realized. More specifically, a device resistance of about 5 to 14 Ω and an operating voltage of about 3.9 to 4.8 V were obtained.

In this embodiment, the n-type $Al_{0.05}Ga_{0.95}N$ layer is used as the current-blocking layer 488. Alternatively, a high-resistance AlGaN layer may also be used, to obtain substantially the same device characteristics as those obtained in this embodiment. The openings 441 serving as the current path are preferably formed at positions above the stripes of the conductive selective growth mask 404, as in the conventional device.

As a comparative example of this embodiment, a semiconductor laser device in which the stripe-shaped conductive selective growth mask 404 is replaced with a stripe-shaped insulating selective growth mask having the same size was fabricated. The device resistance of such a device of the comparative example was about 15 to 23 Ω, twice as high as the device resistance obtained in accordance with the present invention by employing the conductive selective growth mask 404. The effect of using a conductive film as the selective growth mask was thus confirmed.

In this embodiment, a current supplied from the p-type electrode 411 is constricted into the opening 441 formed through the current-blocking layer 488 and then flows via the strip of the conductive selective growth mask 404 located below the active layer 407. This simplifies the structure of the current-blocking type device, and thus reduces the threshold current. As a result, a gallium nitride based compound semiconductor laser device with a stable oscillation mode and good reliability can be realized.

A reliability test was performed for the semiconductor laser device of this embodiment under the conditions of an ambient temperature of 60° C. and a light output of 5 mW. As a result, a lifetime of 12,000 hours or longer was confirmed.

(Embodiment 5)

Figure 5:
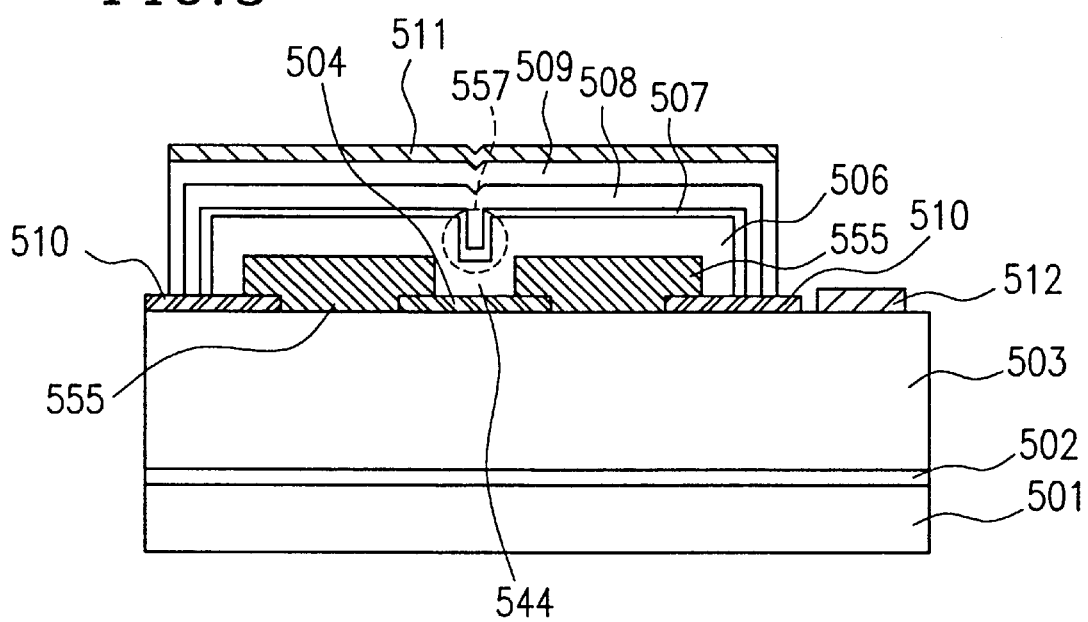
FIG. 5 is a schematic cross-sectional view of a gallium nitride based compound semiconductor light emitting device of Embodiment 5 according to the present invention.

FIG. 5 is a schematic cross-sectional view of a gallium nitride based compound semiconductor laser device as a semiconductor light emitting device of Embodiment 5 according to the present invention.

The semiconductor laser device shown in FIG. 5 includes an n-type GaN substrate 501, an n-type buffer layer 502, an n-type GaN layer 503, a conductive selective growth mask 504 made of an n-type Sb-doped $SnO_2$ layer, an insulating selective growth mask 510 made of an $SiO_2$ film, a p-type $Al_{0.05}Ga_{0.95}N$ current-blocking layer 555, an n-type $Al_{0.1}Ga_{0.9}N$ cladding layer 506, an InGaN multi-quantum well active layer 507 composed of non-doped $In_{0.2}Ga_{0.8}N$ quantum well layers and non-doped $In_{0.01}Ga_{0.99}N$ barrier layers, a p-type $Al_{0.1}Ga_{0.9}N$ cladding layer 508, a p-type GaN contact layer 509, a p-type electrode 511, and an n-type electrode 512. Such a semiconductor laser device is processed into a chip having a width of 400 μm and a length of 600 μm.

Figure 10A:
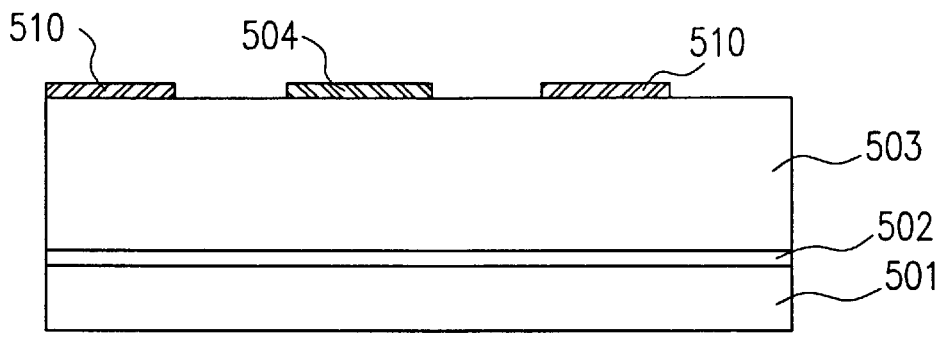
FIGS. 10A to 10C are schematic views illustrating the steps of fabricating the gallium nitride based compound semiconductor light emitting device of Embodiment 5.
Figure 10B:
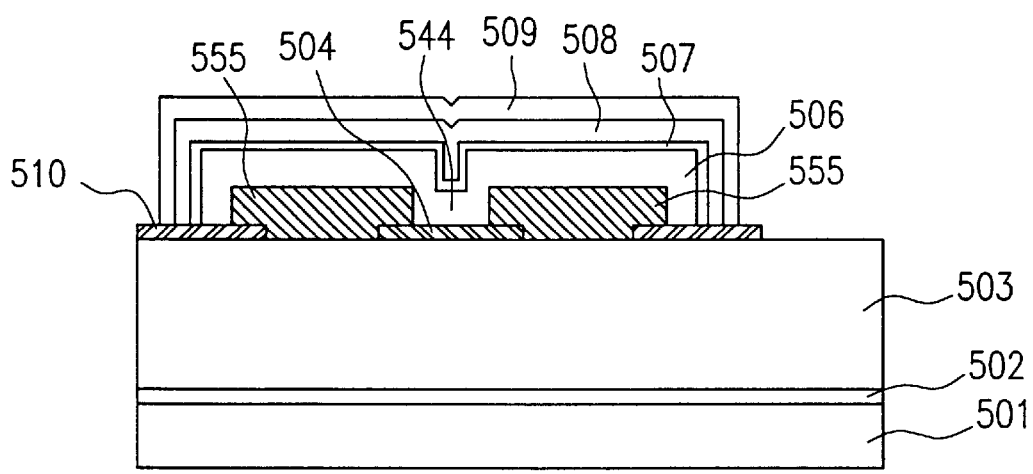
Figure 10C:
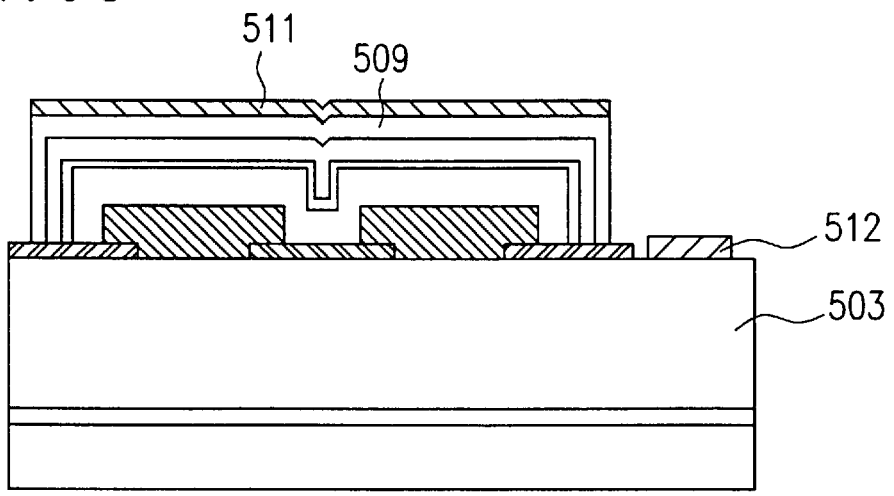
Figure 11:
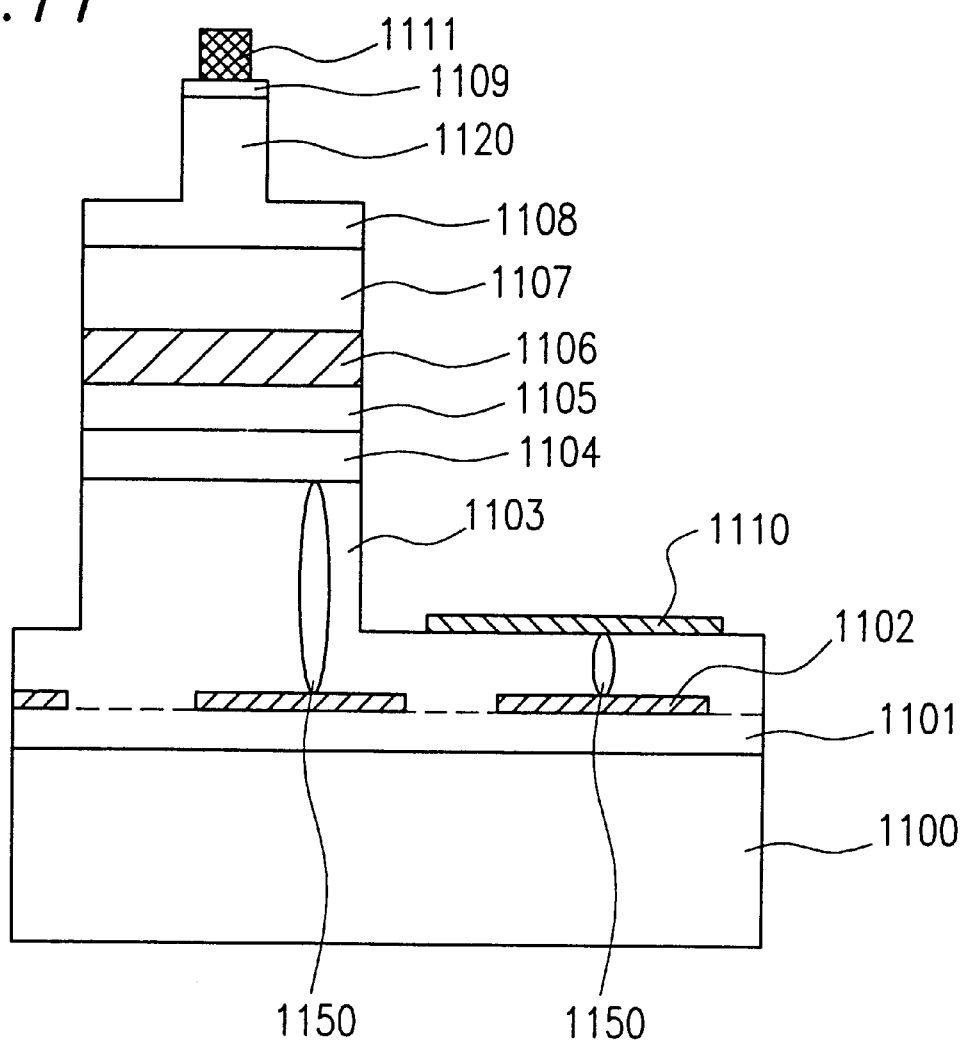
FIG. 11 is a schematic cross-sectional view of a conventional gallium nitride based compound semiconductor laser device.

Referring to FIGS. 10A to 10C, a method for fabricating the gallium nitride based compound semiconductor laser device of this embodiment will be described in detail. The growth method, the V-group source material, the III-group source material, the p-type impurity, the n-type impurity, and the carrier gas used in this embodiment are the same as those described in Embodiment 1.

First, referring to FIG. 10A, using an MOCVD apparatus, the n-type GaN buffer layer 502 is formed on the conductive n-type GaN substrate 501 to a thickness of about 35 nm, and then the n-type GaN contact layer 503 is formed on the n-type GaN buffer layer 502 to a thickness of about 10 μm, to form a layered structure on the wafer.

The wafer with the layered structure is taken out from the MOCVD apparatus, and an Sb-doped $SnO_2$ layer having n-type conductivity, which is to be used as the conductive selective growth mask 504, is formed over the entire surface of the n-type GaN contact layer 503 to a thickness of about 0.5 μm. In this embodiment, the Sb-doped $SnO_2$ layer is formed by sputtering at a film formation temperature of about 350 to 450° C., which is lower than the temperature required for the formation of the Sn-doped $In_2O_3$ film. Such a low temperature is more suitable for the surface of the exposed n-type GaN contact layer 503. The Sb-doped $SnO_2$ layer is then etched in a method similar to that described in Embodiment 2, to form the stripe-shaped conductive selective growth mask 504 having a stripe width of 5 μm.

Subsequently, an $SiO_2$ film which is to be used as the insulating selective growth mask 510 is formed on the resultant structure. The $SiO_2$ film is then etched so that stripes of the insulating selective growth mask 510 with a width of about 280 μm extending in <11–20> direction are located apart from the stripes of the conductive selective growth mask 504 by a distance of about 10 μm as shown in FIG. 10A.

Referring to FIG. 10B, the thus-fabricated wafer is put in the MOCVD apparatus again. The p-type $Al_{0.05}Ga_{0.95}N$ current-blocking layer 555 having ridges with a rectangular shaped cross-section is grown on the resultant wafer to a thickness of about 5 μm for six minutes at a substrate temperature of 1050° C. so that an opening 544 having a width of about 3 μm is formed on the stripe of the conductive selective growth mask 504.

Thereafter, the n-type $Al_{0.1}Ga_{0.9}N$ cladding layer 506 having a thickness of about 0.3 μm is formed over the p-type $Al_{0.05}Ga_{0.95}N$ current-blocking layer 555 including the opening 544. After the substrate temperature is reduced to about 800° C., the InGaN multi-quantum well active layer 507 composed of two non-doped $In_{0.2}Ga_{0.8}N$ quantum well layers each having a thickness of 2 nm and three non-doped $In_{0.01}Ga_{0.99}N$ barrier layers each having a thickness of 5 nm is formed on the cladding layer 506. After the substrate temperature is increased to about 1050° C., the p-type $Al_{0.1}Ga_{0.9}N$ cladding layer 508 having a thickness of about 0.3 μm and then the p-type GaN contact layer 509 having a thickness of about 0.5 μm are formed in this order, to form a layered structure as shown in FIG. 10B.

Referring to FIG. 10C, the wafer with the thus-fabricated layered structure is taken out from the MOCVD apparatus, and the p-type electrode 511 is formed on the p-type GaN contact layer 509. Thereafter, the n-type electrode 512 is formed on the surface of the n-type GaN contact layer 503 exposed by etching. In this way, the structure as shown in FIG. 10C is formed.

The resultant wafer is cut into chips having the size as described previously to form a semiconductor laser device.

Thus, in the semiconductor laser device of this embodiment, the n-type electrode 512 is formed on the surface of the n-type GaN contact layer 503. The current is therefore prevented from crossing the areas of the semiconductor layer located above the stripes of the conductive selective growth mask 504 and the insulating selective growth mask 510 in the lateral direction. Thus, the problems of a high resistance and a high operating voltage found in the conventional semiconductor laser device are suppressed, realizing the device resistance of about 8 to 20 Ω and the operating voltage of about 4 to 5.6 V.

Moreover, in this embodiment, since the current-blocking layer 555 is made of a material containing Al, the opening 544 of a rectangular cross-section is formed. Accordingly, the overlying active layer 507 has a downward projecting portion (encircled by a dotted circle 557 in FIG. 5) at the position corresponding to the opening 544. As a result, such a downward projecting portion 557 of the active layer 507 is sandwiched by the cladding layers having different refractive indices in the lateral direction. Thus, a so-called refractive index waveguide type gallium nitride semiconductor laser device with a stable lateral mode, a reduced threshold current, and good reliability is realized.

In this embodiment, the n-type electrode 512 is formed on the surface of the n-type GaN contact layer 503. Alternatively, the n-type electrode 512 may be formed on the entire back surface of the n-type GaN substrate 501 which is a conductive substrate. In this case, the device resistance is about 5 to 16 Ω and the operating voltage is about 3.8 to 4.3 V, which are smaller than those obtained when the n-type electrode 512 is formed on the n-type GaN contact layer 503.

The lifetime of the semiconductor laser device of this embodiment under the conditions of an ambient temperature of 60° C. and a light output of 5 mW was about 15,000 hours.

Thus, according to the present invention, a current injected from an electrode located closer to the substrate flows into the active layer via the contact layer which is located below the conductive selective growth mask and free from crystal cracks and non-grown portions and via the conductive selective growth mask. Accordingly, a gallium nitride based compound semiconductor light emitting device with a low resistance, a low operating voltage, and good reliability can be fabricated.

Moreover, the current path can be defined in a self-alignment manner by forming a current-blocking layer with crystal growth starting from both sides of the conductive selective growth mask. This allows for reduction of the threshold current. Accordingly, with a reduced threshold current, a gallium nitride based compound semiconductor light emitting device with a stable oscillation mode and good reliability can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device comprising:
   a substrate;
   a contact layer made of a gallium nitride based compound semiconductor formed on the substrate;
   a stripe-shaped conductive selective growth mask formed above the contact layer; and
   a layered structure made of a gallium nitride based compound semiconductor, the layered structure including at least a pair of cladding layers, formed on the conductive selective growth mask, and an active layer, including at least one layer, sandwiched by the cladding layers.

2. A semiconductor light emitting device according to claim 1, further comprising a current-blocking layer formed on both sides of a stripe of the conductive selective growth mask.

3. A semiconductor light emitting device according to claim 2, further comprising an insulating selective growth mask in at least a portion of the current-blocking layer.

4. A semiconductor light emitting device according to claim 3, wherein the substrate is an insulating substrate, the width of the stripe of the conductive selective growth mask is smaller than the width of each stripe of the insulating selective growth mask, and an electrode is formed on a surface of the contact layer located farther from the substrate.

5. A semiconductor light emitting device according to claim 3, wherein the insulating selective growth mask is made of silicon oxide or silicon nitride.

6. A semiconductor light emitting device according to claim 1, wherein the conductive selective growth mask is made of an oxide semiconductor material.

7. The semiconductor light emitting device of claim 6, further comprising an n-type electrode on the contact layer at a position closer to the substrate than the conductive selective growth mask.

8. A semiconductor light emitting device according to claim 1, further comprising a current blocking layer which has an opening at a position located above a stripe of the conductive selective growth mask.

9. A method for fabricating a semiconductor light emitting device comprising the steps of:
   forming a contact layer made of a gallium nitride based compound semiconductor on a substrate;
   forming a conductive selective growth mask and an insulating selective growth mask on the contact layer; and
   forming a layered structure, made of a gallium nitride based compound semiconductor, above the conductive selective growth mask, the insulating selective growth mask, and the contact layer, the layered structure including at least a pair of cladding layers and an active layer.

* * * * *